United States Patent
Shaheen et al.

(10) Patent No.: US 6,645,831 B1
(45) Date of Patent: Nov. 11, 2003

(54) THERMALLY STABLE CRYSTALLINE DEFECT-FREE GERMANIUM BONDED TO SILICON AND SILICON DIOXIDE

(75) Inventors: Mohamad A. Shaheen, Portland, OR (US); Beenyih Jin, Lake Oswego, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/141,596

(22) Filed: May 7, 2002

(51) Int. Cl.[7] ............................................... H01L 21/30
(52) U.S. Cl. ...................... 438/455; 438/456; 438/457; 438/458; 438/459; 438/752
(58) Field of Search ................................ 438/455, 456, 438/457, 458, 459, 752; 257/506, 631

(56) References Cited

U.S. PATENT DOCUMENTS 5,603,779 A * 2/1997 Linn et al. .................... 148/33
5,769,991 A   6/1998 Miyazawa et al.
5,882,987 A * 3/1999 Srikrishnan ................. 438/458
2002/0190269 A1 * 12/2002 Atwater, Jr. et al. ........ 257/184

OTHER PUBLICATIONS

T.Glinsner, T. Luxbacher, P. Lindner, C. Schaefer, R. Michaels, J. Paqlensky, V. Dragoi, and M. Reiche, "Reversible and Permanent Wafer Bonding for GaAs Processing," Proc. GaAS MANTECH Conf., (2001) pp. 1–4.*
S.M. Sze, "Physics of Semiconductor Devices," John Wiley & Sons, New York, (1981) Appendix H.*

* cited by examiner

Primary Examiner—Tom Thomas
Assistant Examiner—Thomas Magee
(74) Attorney, Agent, or Firm—Blakely, Sokoloff, Taylor & Zafman LLP (57) ABSTRACT

A wafer pair comprising a substantially defect-free germanium wafer and methods of making the same. The wafer pair comprises the substantially defect-free germanium wafer directly bonded to a silicon wafer. The method of making the wafer pair comprises placing the silicon wafer in a wafer-bonding chamber, placing the germanium wafer on top or on bottom of the silicon wafer, and applying a local force to either the germanium wafer or to the silicon wafer to initiate bonding of the germanium wafer to the silicon wafer. The bonding occurs under a temperature ranging from about 23° C. to about 600° C. and under a vacuum condition inside a wafer-bonding chamber.

25 Claims, 11 Drawing Sheets

FIG. 7G

THERMALLY STABLE CRYSTALLINE DEFECT-FREE GERMANIUM BONDED TO SILICON AND SILICON DIOXIDE

BACKGROUND

1. Field

The present invention relates to a substantially defect-free germanium wafer for use in a semiconductor device and in particular, to semiconductor devices comprising a substantially defect-free germanium wafer bonded to a silicon containing substrate without the need of an intermediate layer. The present invention further concerns the methods for making and using such devices.

2. Discussion of Related Art

There is increasing interest in using silicon-germanium (Si—Ge) alloy as a material for microelectronic and optoelectronic device applications. Germanium (Ge) is known to have high carrier mobility (e.g., high hole and electron mobility) and optical absorption as compared to silicon (Si). This is one reason why Ge is useful for devices that require enhanced performance and/or high quantum efficiency. Examples of devices that would benefit from the use of a Ge film include metal-oxide-semiconductor (MOS) transistors, optical detectors, and other optoelectronic devices, to name a few.

Forming high quality germanium layers on a substrate is desirable. Ge layers grown on a Si substrate can be used to make high mobility devices. Bulk Si substrates typically have lower electron and hole mobility than Ge substrates. Si typically has an electron mobility of 1500 $cm^2$ N/s and a hole mobility of 450 $cm^2$ N/s whereas Ge has an electron mobility of 3900 $cm^2$ N/s and a hole mobility of 1900 $cm^2$ N/s. Additionally, electronic devices made using bulk Si substrates require high power consumption due to current substrate leakage, especially for high performance devices. The lower mobility and the current substrate leakage problem in using bulk Si for substrate set upper limits on the performance of the electronic devices with regard to material and power dissipation aspects. On the other hand, electronic devices made with Ge require less voltage bias to turn on the devices because of the Ge's high mobility characteristic. In addition, the use of the banded Ge to Si substrate allows the use existing infrastructure for Si substrate.

In the current art, electronic devices have been fabricated on Si substrate with a Ge film grown on an intermediate buffer layer (e.g., SiGe buffer layer) (e.g., through chemical vapor deposition). There is a large lattice-mismatched of about 4% between the Ge and the Si making the growing of the Ge film on a Si substrate to contain crystalline defects such as mistfit dislocations and high stress, which subsequently forms threading segments that penetrate the entire epitaxial layer and terminate at the free surface. The defect is even higher for thinner Ge film and thinner Ge films are desirable for many devices.

Defects in the germanium layer in a Si—Ge alloy are undesirable since they reduce Ge's carrier mobility, and adversely affect the electronic quality and performance reliability of various electronic devices. And, bonding of a Ge wafer directly a Si wafer have not been successful because such bonding suffers from other defects such as thermally induced slip, bonding voids, unstable or weak interface and crystalline defect.

BRIEF DESCRIPTION OF THE DRAWINGS

The invention will be understood more fully from the detailed description given below and from the accompanying drawings of various embodiments of the invention, which, however, should not be taken to limit the invention to the specific embodiments, but are for explanation and understanding only. In the drawings.

DETAILED DESCRIPTION OF THE PRESENT INVENTION

In the following description, for purposes of explanation, numerous specific details are set forth. It will be evident, however, to one skilled in the art that the embodiments of present invention may be practiced without these specific details. In other instances, specific apparatus structures and methods have not been described so as not to obscure the present invention.

Defect-free germanium (Ge) is a key issue affecting the integration of silicon substrates having Ge films for silicon integrated circuits in electronic, optoelectronic applications and other suitable electronic devices, for example, in making transistors and detectors. The embodiments of the present invention direct to methods of bonding a Ge wafer directly to a semiconductor wafer such as silicon (Si) wafer or silicon containing wafer that results in substantially defect-free wafer pair. The term wafer pair refers to the Ge wafer bonded to the semiconductor wafer mentioned above. To create the substantially defect-free wafer pair, a Ge wafer is placed on the top of or on the bottom of the semiconductor wafer. A local force is applied to either the Ge wafer or to the semiconductor wafer at a region near the edge of the Ge wafer or the semiconductor wafer to initiate the bonding. When the Ge wafer is bonded to the semiconductor wafer using the embodiments of the present invention, the interface of the Ge wafer and the semiconductor wafer is substantially defect-free. The Ge wafer is also substantially defect-free.

For the Ge wafer to be substantially defect-free, the interface of the wafer pair needs to be substantially defect-free because defect at the interface will act as a nucleation of defects that will eventually propagate into the wafers (e.g., into the Ge wafer) creating defects in the wafers. The substantially defect-free interface of the wafer pair allows the Ge wafer to remain as free of defect as the initial Ge wafer that is used for the bonding of the Ge wafer to the semiconductor wafer. For example, when the initial Ge wafer is free of any defect prior to the bonding, the Ge wafer after the bonding also has no defect. The term "substantially defect-free" thus refers to the superior quality (e.g., the substantially defect-free) of the interface of the wafer pair. The substantially defect-free interface of the wafer pair further gives the interface qualities such as thermally stable, slip free, and void free. The substantially defect-free interface gives the Ge wafer that is bonded to the semiconductor wafer a high crystalline integrity during thermal processing. The quality of the interface is determined based on conventional Infrared (IR) scans, which typically have a detection limit of about 10 µm. Defects such as bonding voids are typically on the order of microns. When the IR scans having a detection limit of about 10 µm is used to analyze the quality of the interface and the result show no detection of defect through the IR scans; this lack of defect detection indicates that the interface is defect-free or at least, substantially defect-free. Substantially defect-free thus also refers to any defect that falls below the typical detection limit of the IR scans. Hence, the term substantially defect-free also refers to defect at the interface of the wafer pair and defect in the Ge wafer after bonded to the semiconductor wafer that are falling below conventional detection limit using conventional methods such as IR scanning used to determine crystalline defects in a film.

Figure 1:
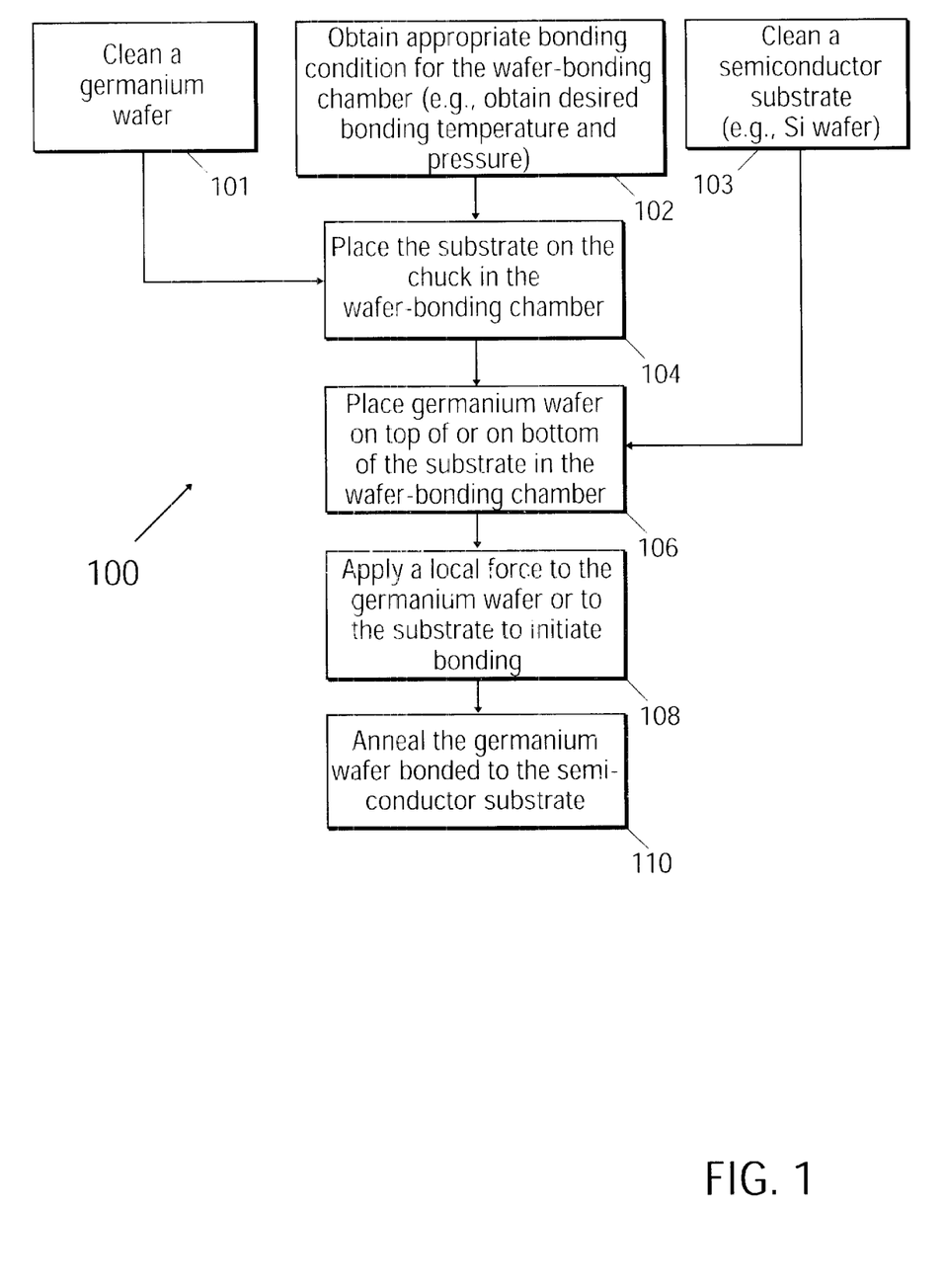
FIG. 1 illustrates an exemplary method of forming a substantially defect-free germanium wafer bonded to a silicon wafer.

FIG. 1 illustrates an exemplary method 100 of forming a substantially defect-free germanium film by bonding a Ge wafer to a semiconductor wafer. The semiconductor wafer that can be used for the embodiments described in this discussion includes a Si wafer, a Si containing wafer, or a Si wafer having an oxide layer (e.g., silicon oxide layer). The Ge wafer that can be used includes monocrystalline Ge. At box 101, a Ge wafer is cleaned (e.g. washed and dried). In one example, the Ge wafer has a thickness of about 150 µm. The starting thickness of the Ge wafer can be any suitable thickness. In one example, the cleaning of the Ge wafer includes treating the Ge wafer such that it has hydrophilic surfaces. In one example, only the surface of the Ge wafer that is to be bonded to the semiconductor wafer needs to be hydrophilic. One exemplary method of cleaning the Ge wafer includes washing the Ge wafer with a hydrofluoric solution (HF solution) having a concentration of about less than 0.05% (v/v) and rinsing the Ge wafer with deionized water or isopropanol (IPA). The drying of the Ge wafer can be done by spinning the Ge wafer to air dry the Ge wafer or with assistance of an alcohol reagent (e.g., isopropanol alcohol) while spinning the Ge wafer. Additionally the Ge wafer can further be dried by spinning the Ge wafer, which air dries the Ge wafer. The drying may be assisted by using an alcohol reagent (e.g., isopropanol alcohol) while spinning the Ge wafer. The cleaning of the Ge wafer according to the embodiments forms OH groups on the surfaces of the Ge wafer.

Continuing with FIG. 1, at box 103 of method 100, a semiconductor wafer (e.g., silicon wafer) is cleaned. In the embodiments below, the semiconductor wafer being used for this discussion is a silicon containing wafer such as monocrystalline silicon, or silicon having a silicon dioxide layer ($SiO_2$). It is to be understood that the embodiments can be modified or optimized for other semiconductor wafers. The cleaning of the silicon wafer also gives the silicon wafer hydrophilic surfaces. In one example, only the surface of the silicon wafer that is to be bonded to the Ge wafer needs to be hydrophilic. One exemplary method of cleaning the Si wafer includes washing the Si wafer with an HF solution, similar to box 101 described above and rinsing the Si wafer with deionized water or IPA. Additionally, the Si wafer can further be dried by spinning the Si wafer, optionally with assistance of an alcohol reagent (e.g., isopropanol alcohol) to air dry the Si wafer.

Continuing with FIG. 1, at box 102 of method 100, an appropriate bonding condition for a wafer-bonding chamber is obtained. The bonding condition includes a controlled bonding temperature and bonding pressure for the bonding of the Ge wafer to the Si wafer. In one example, the wafer-bonding chamber is a conventional wafer-bonding chamber typically used to bond a Si wafer to a Si wafer. One example of such conventional wafer-bonding chamber is the EVG 850 Series or the EVG 650 Series wafer bonders made by EV Group, Austria. The wafer-bonding chamber used for the method 100 must be able to maintain the bonding temperature and bonding pressure. In one example, the bonding temperature is obtained by heating up the wafer-bonding chamber to a desired temperature, (e.g., a temperature ranging from 22° C. to 600° C.). In another example, a chuck, which is used to hold the wafers, is heated up to the desired temperature for bonding. The bonding pressure is obtained by evacuating the wafer-bonding chamber to a vacuum condition. The pressure of the wafer-bonding chamber can be obtained by using a conventional mechanical pump connected to the wafer-bonding chamber. The pressure of the wafer-bonding chamber is a pressure under which the mutual sticking of the Ge wafer to the Si wafer does not commence and that the Ge wafer and the Si wafer are held with respect to each other. In one example, the pressure of the wafer-bonding chamber is below 1 Torr. In another example, the pressure of the wafer-bonding chamber is about 1 mili Torr.

The wafer-bonding chamber provides a clean and dry environment for the bonding to occur. Further, as the Ge wafer and the Si wafer are cleaned, they have clean atomically smooth surfaces, especially the surfaces that are to be bonded to each other. The present of small particles (e.g., particles having size larger than about 0.1–0.2 µm) would interrupt the bonding of the wafers and lead to void and decreasing bonding strength.

The mutual sticking forces of the OH groups on the surfaces of the Ge wafer and the Si wafer are utilized to effect the bonding of the Ge wafer to the Si wafer. The bonding of the Ge wafer to the Si wafer is attainable with hydrogen bonds formed by the action of the OH groups on the Ge wafer and the Si wafer. In one example, a moisture containing carrier gas such as nitrogen, xenon and helium is introduced into the wafer-bonding chamber at a flow rate of about 10 ml–100 ml per minute.

Continuing with FIG. 1, at box 104, the cleaned or treated Si wafer is placed on a chuck inside the wafer-bonding chamber. The bonding may occur with the Si wafer being on the bottom and the Ge wafer being on top. Alternatively, the bonding may occur with the Ge wafer being on the bottom and the Si wafer being on top. As mentioned, in box 104, the Si wafer is placed on the chuck, thus, in this case, the Si wafer is at the bottom. The wafer-bonding chamber may be allowed to equilibrated after the Si wafer is placed on the chuck, if necessary. At box 106, the cleaned or treated Ge wafer is placed on top of or on the bottom of the Si wafer. In the example where the Si wafer is placed on the chuck, the Ge wafer is place on the top of the Si wafer. In another example, the Ge wafer may be placed on the chuck and the Si wafer may be placed on top of the Ge wafer. The Ge wafer is thus placed on the bottom of the Si wafer. The wafer-bonding chamber may again be allowed to equilibrate after Ge wafer is placed on top or on bottom of the Si wafer, if necessary.

At box 108, a local force is applied to the Ge wafer to initiate the bonding of the Ge wafer to the Si wafer. Alternatively, in the example where the Si wafer is on top and the Ge wafer is on the bottom, the local force is applied to the Si wafer to initiate the bonding. In one example, the local force is a force applied to one point on the Ge wafer. In another example, the local force is applied to a region near an edge of the Ge wafer using a Teflon pin conveying a force ranging from 3 Newton to 4000 Newton pressing down on that region. In a preferred embodiment, the local force is about 2000 Newton. The local force of the method 100 initiates the bonding of the Ge wafer to the Si wafer. The local force initiates the bonding with the hydrogen bond forces. Once the bonding is initiated, the bonding is propagated to completely bond the Ge wafer to the Si wafer. In one example, the Ge wafer is left on top of the Si wafer for some time (e.g., 30 seconds or more) until the Ge wafer entirely sticks itself to the semiconductor wafer. This time may increase depending on the size or the thickness of the Ge wafer and the Si wafer. In one example where the Si wafer is on top of the Ge wafer, the same local force is applied to a region on the Si wafer to initiate the bonding. The wafer-bonding chamber used for the method 100 is further described below.

Continuing with FIG. 1, at box 110, the Ge wafer bonded to the Si wafer is annealed. In one example, the annealing process takes place in the same wafer-bonding chamber that is used for the bonding method 100. During annealing, the temperature of the wafer-bonding chamber is set to a temperature that is higher than the temperature used for the bonding. For example, if the bonding of the Ge wafer to semiconductor wafer is done at 25° C., the annealing temperature should be at least 100° C. The annealing temperature can be as high as 600° C. or as high as 75% of the melting temperature of the wafers. The annealing process removes any moisture at the interface of the Ge wafer and the semiconductor wafer. In one example, the wafer pair is annealed in the same wafer-bonding chamber that is used to bond the Ge wafer to the semiconductor wafer in the presence of a carrier gas such as nitrogen and at a temperature of about 150° C. The chamber is heated up to 100° C. at a rate of 1° C./minute while the wafer pair remains in the chamber. The chamber is maintained at 100° C. for 2 hours. Following that, with the wafer pair inside the chamber, the chamber is heated up to 150° C. at a rate of 1° C./minute. The chamber is maintained at 150° C. for 6 hours. The wafer pair is then cooled down by ramping down the temperature inside the chamber. In one example the chamber is cooled down naturally at a rate of 2° C./minute.

Figure 2:
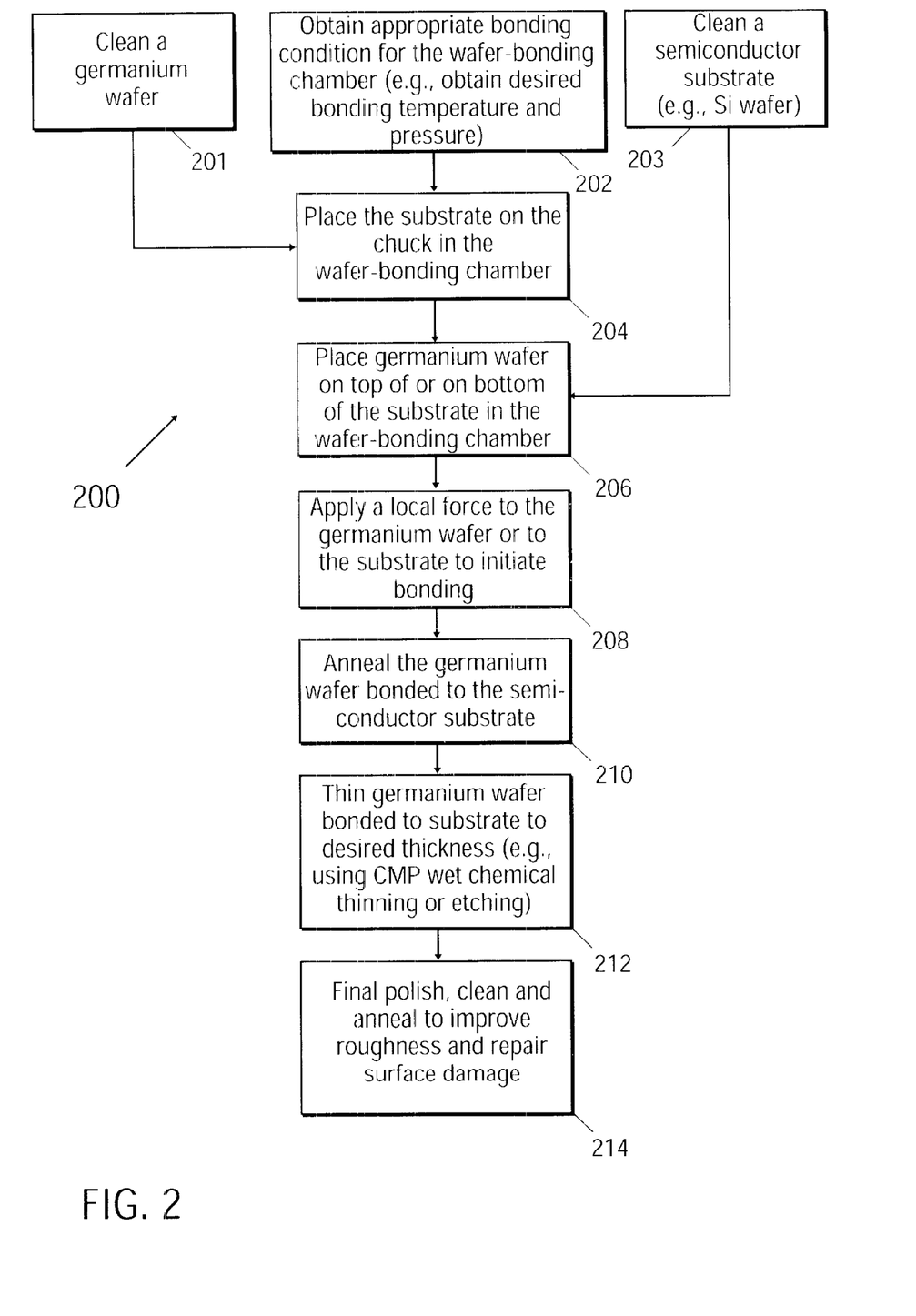
FIG. 2 illustrates another exemplary method of forming a substantially defect-free germanium wafer bonded to a silicon wafer.

FIG. 2 illustrates another exemplary method of forming a substantially defect-free germanium film by bonding a Ge wafer to a Si wafer, method 200. The method 200 is similar to the method 100 described above with an additional step of thinning the Ge wafer that has been bonded to the Si wafer.

At box 201, a Ge wafer is cleaned or treated as in the method 100. In one example, the Ge wafer has a thickness of about 150 μm. At box 203, a Si wafer is also cleaned or treated as in the method 100. At box 202, an appropriate bonding condition for a wafer-bonding chamber is obtained. Similar to the method 100, in one example, the bonding temperature is obtained by heating up the wafer-bonding chamber to a desired temperature, (e.g., a temperature ranging from 22° C. to 600° C.). Alternatively, a chuck for placing the wafers inside the wafer-bonding chamber is heated to the desired temperature for bonding. The bonding pressure is obtained by evacuating the wafer-bonding chamber to a vacuum condition. Alternatively, a mechanical pump connected to the wafer-bonding chamber is used to evacuate the chamber to the vacuum condition. In one example, the pressure of the wafer-bonding chamber is below 1 Torr. The wafer-bonding chamber used for the method 200 also provides a clean and dry environment.

Continuing with FIG. 2, at box 204, the cleaned or treated Si wafer is placed on a chuck inside the wafer-bonding chamber. The wafer-bonding chamber may be allowed to equilibrated after the Si wafer is placed on the chuck, if necessary. At box 206, the cleaned or treated Ge wafer is placed on top of the Si wafer. The wafer-bonding chamber may again be allowed to equilibrate after Ge wafer is placed on top of the Si wafer, if necessary. Alternatively, the cleaned or treated Ge wafer is first placed on the chuck in the chamber. The Si wafer is then place don top of the Ge wafer.

At box 208, a local force is applied to the Ge wafer to initiate the bonding of the Ge wafer to the Si wafer. In one example, the local force is applied to a region near an edge of the Ge wafer using a Teflon pin to convey a force ranging from 3 Newton to 400 Newton pressing down on that region. The local force of the method 200 is sufficient to initiate the bonding of the Ge wafer to the Si wafer. Once the bonding is initiated, the bonding is propagated to completely bond the Ge wafer to the Si wafer.

At box 210, the Ge wafer bonded to the Si wafer is annealed. In one example, the annealing process takes place in the same wafer-bonding chamber that is used for the bonding method 200. During annealing, the temperature of the wafer-bonding chamber is set to a temperature that is higher than the temperature used for the bonding. For example, if the bonding of the Ge wafer to semiconductor wafer is done at 25° C., the annealing temperature should be at least 100° C. The annealing temperature can be as high as 600° C. or 75% of the melting temperature of the wafers.

Figure 3:
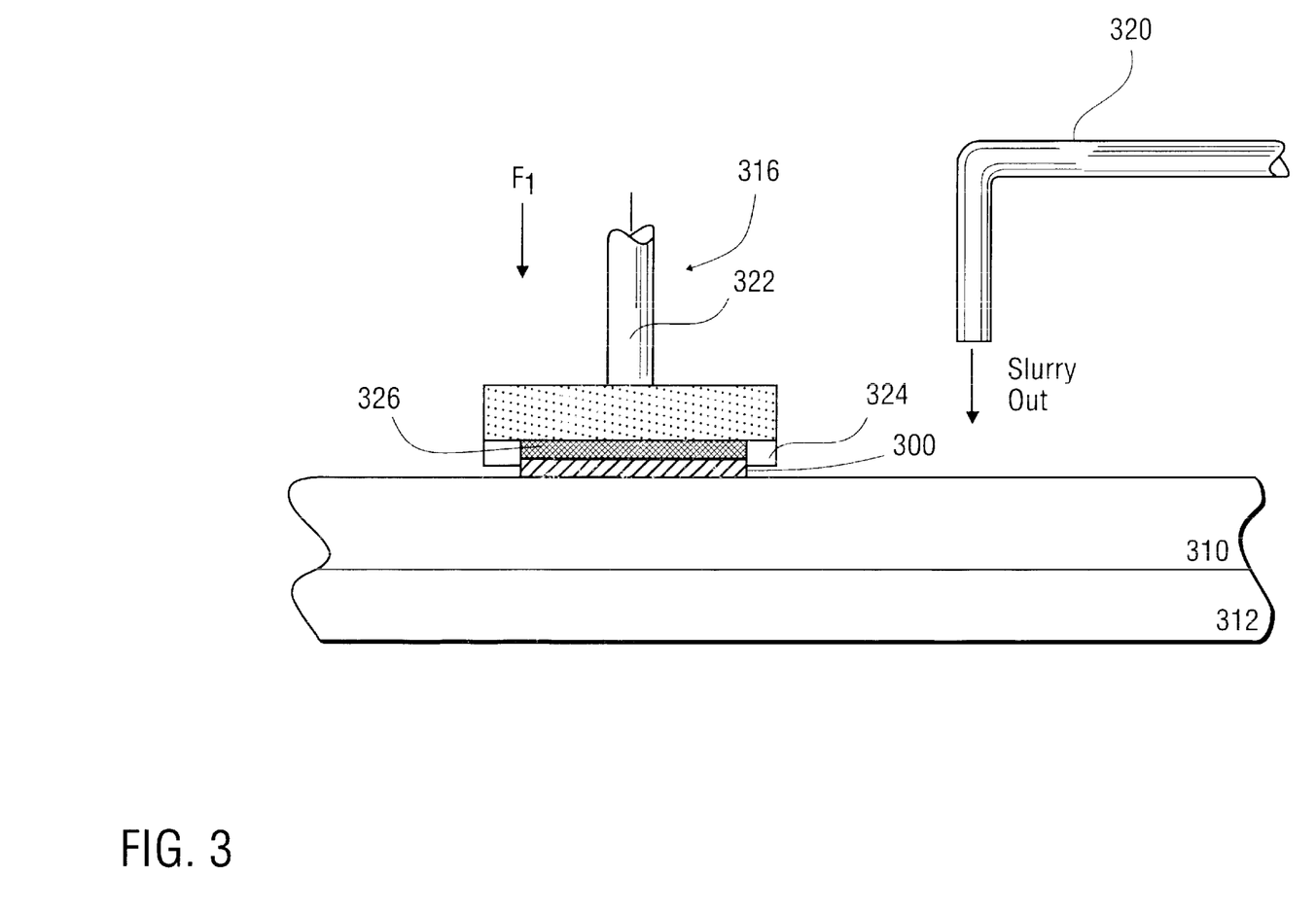
FIG. 3 illustrates an exemplary method chemical mechanical polishing device that can be used to thin the germanium wafer bonded to the silicon wafer.

At box 212, the Ge wafer bonded to the, semiconductor wafer is thinned down to a desired thickness using conventional method such as chemical mechanical polishing (CMP) wet chemical treatment, or wet/dry etching method well known in the art. In one example, a CMP tool illustrated in FIG. 3 is used to thin the Ge wafer. At box 214, the Ge wafer bonded to the semiconductor wafer is polished, cleaned and annealed using conventional techniques to improve surface roughness and to repair any surface damage.

FIG. 3 illustrates an exemplary method of thinning down the Ge wafer that is bonded to the Si wafer. As shown in FIG. 3, a wafer pair 300 indicates the Ge wafer bonded to a Si wafer. The Ge wafer is chemical mechanically polished down to a desired thickness. In one example, the Ge wafer is chemical mechanically polished down from an initial thickness of 150 μm to less than 50 μm. Using CMP, the Ge wafer can be thinned down to any thickness, for example, less than 1 μm. In one example, the wafer pair 300 is placed face down on a polishing pad 310 attached to a rotatable table 312. In the Ge wafer bonded to the Si wafer, the Ge wafer is one facing the polishing pad 310. Thus, the Ge wafer to be thinned is placed in direct contact with polishing pad 310. A carrier 316 is used to forcibly press the wafer pair 300 down against the polishing pad 310 during polishing. A slurry is deposited onto the polishing pad 310 from a nozzle 320 during polishing. Slurry chemically passivates or oxidizes the Ge wafer being polished and then abrasively removes or polishes off the passivated or oxidized surface. The chemically reactive slurry facilitates the removal of the Ge wafer as the pad 310 and the wafer pair 300 are rotated relative to one another under a polishing pressure $F_1$ applied by the carrier 316. Polishing is continued in this manner until the desired thickness is achieved.

The slurry can be a conventional slurry used to polish a semiconductor wafer. The slurry comprises an oxidizing agent and an abrasive. The oxidizing agent oxidizes the Ge wafer and the abrasive physically removes the oxidized Ge wafer. Oxidizing agents including, but not limited to, potassium ferricyanide, potassium dichromate, potassium iodate, potassium bromate, and vanadium trioxide. An abrasive, such as silica, alumina, or ceria, is provided in the slurry to physically or mechanically strip the passivated surface of the Ge being polished. Silica is the preferred abrasive in the present invention because it can be used without scratching the surface of the Ge wafer. The abrasive can be a colloidal silica is manufactured by Cabot, Inc. and sold under the trade name Semi-Sperse TM-25. (Semi-Sperse TM-25 comprises approximately 25% by weight silica, a small amount of KOH and deionized water). An alternative colloidal Silica is Cab-O-Sperse ® TM which is also manufactured by Cabot, Inc. (Cab-O-Sperse ® TM. comprises approximately 15% weight percent silica and the remainder deionized water.)

Another slurry that can be used is Levasil made by Bayer Electronic Chemical, which has a chemical name of Colloidal silicic acid in aqueous solution (amorphous silicon dioxide in water) otherwise known as silica slurry. Bayer Electronic Chemical is a division of Bayer Corporation located in Pittsburgh, Pa.

The polishing pad 310 can be formed of a variety of different materials. For example, the polishing pad 310 can be a hard pad such as the IC-60 pad manufactured by Rodel Corporation. Additionally, the polishing pad 310 can be a relatively soft pad such as the Polytech Supreme pad also manufactured by Rodel Corp. A soft polishing pad is thought to provide improved polish removal rates and improved uniformity. What is important, however, is for the polishing pad 310 to adequately and uniformly deliver the slurry across the entire Ge wafer and polishing pad interface. A plurality-of performed grooves (not shown) can be added to the polishing pad 310 to help transport slurry about the Ge wafer and polishing pad interface. Additionally, the slurry needs not be simply deposited onto the polishing pad 310 from the nozzle 320, as shown in FIG. 3, but rather can be pumped through the polishing pad directly to the wafer pad interface as well known in the field.

A carrier 316 can be used to forcibly press and rotate the wafer pair 300 against the polishing pad 310 during polishing. A shaft 322 is used to apply a downward force $F_1$ (between 2–12 psi) and to rotate the wafer pair 300 during polishing. An ordinary retaining ring 324 can be used to prevent wafer pair 300 from slipping laterally during polishing. An insert pad 326 is preferably used to cushion wafer pair 300 from the carrier 316. Wet surface tension or vacuum pressure can be used to hold the wafer pair 300 in place.

Another exemplary method of thinning down the Ge wafer that is bonded to the Si wafer is wet chemical etching. In one example, a commercial silicon etchant is used to etch the wafer pair. An example of such an etchant is CP-4A which is a commercial name for a solution containing $CO_2H$, hydrofluoric acid (HF), nitric acid ($HNO_3$) and glacial acetic acid ($CH_3CO_2H$). The CP-4A etchant has typical concentration of $3HF:5HNO_3:3CH_3CO_2H$. The etchant can also be made by mixing 3 parts of a 49% HF (v/v) with 5 parts 70% $HNO_3$ (v/v) and with 3 parts 100% $CH_3CO_2H$ (v/v) together. The etchant is poured into a container into which the wafer pair is deposited. The wafer pair is left inside the container containing the etchant for a predetermined amount of time, e.g., 5 to 10 minutes to obtain the desired thickness for the Ge wafer. Note that the Si wafer will also be etched. In one example, the etching rate is about 10 to 15 $\mu$m per minute. The rate of etching can be optimized by varying the concentration of the elements of the etchant. Duration of 5 to 10 minutes is sufficient to thin the Ge wafer from 15 $\mu$m to 20 $\mu$m. In other examples, the duration is varied to obtain different thickness for the Ge wafer. Since the Si wafer will also be etched in this process, the thickness of the Si wafer may be chosen accordingly to account for the etching of the wafer during the thinning process of the Ge wafer.

Figure 4A:
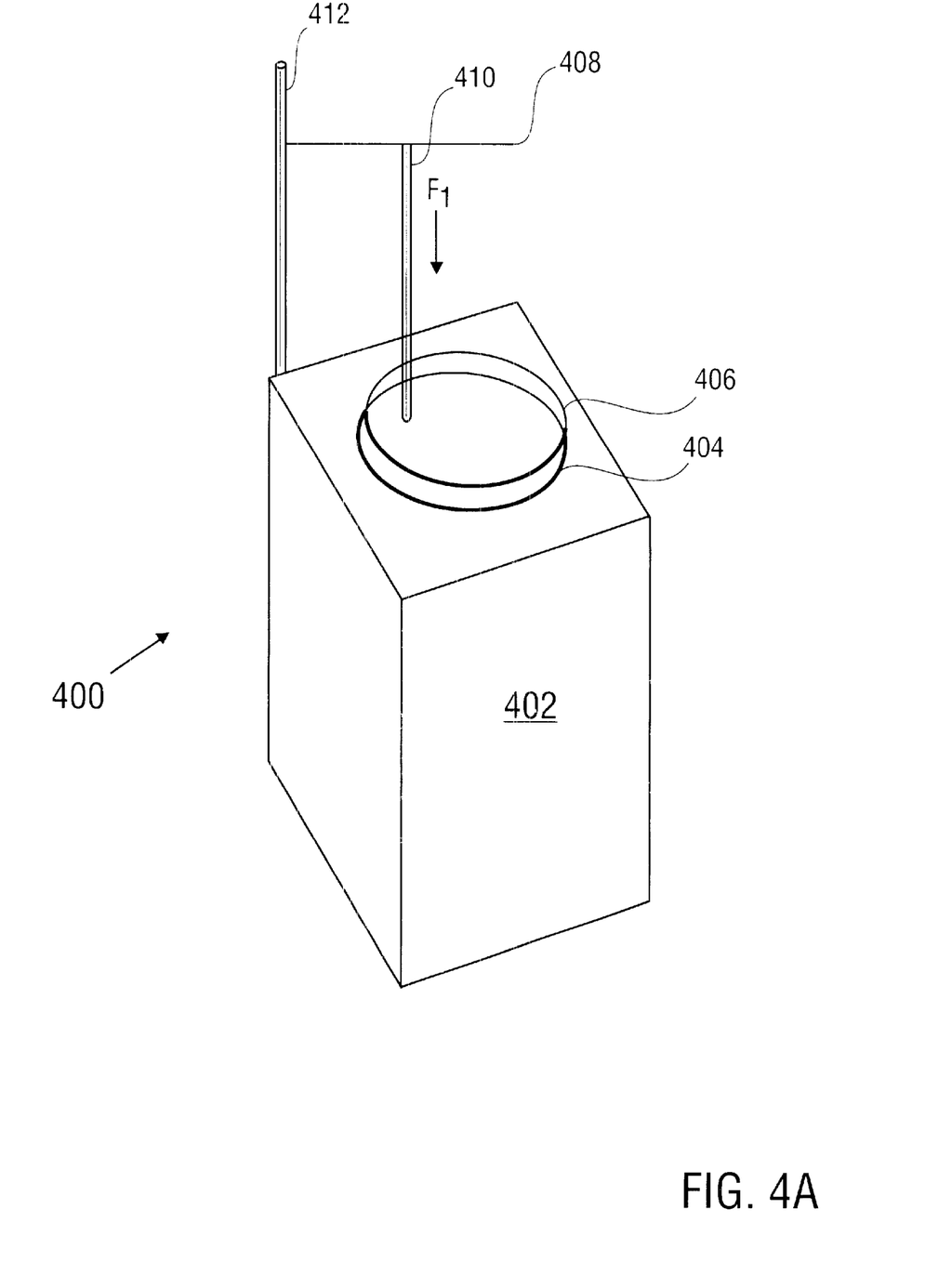
FIGS. 4A to 4C illustrates an exemplary wafer bonding chamber.
Figure 4B:
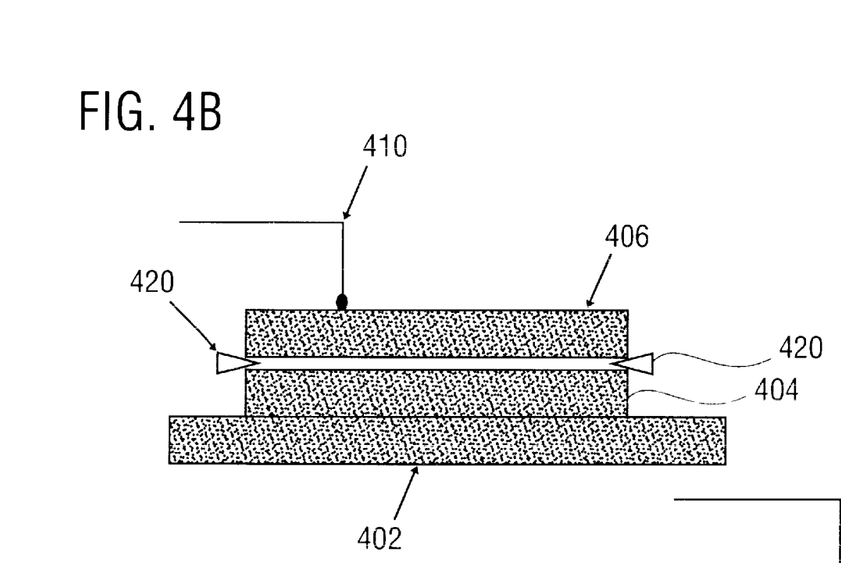

FIG. 4A illustrates an exemplary wafer-bonding chamber 400 that can be used for the method 100 discussed in FIG. 1 and the method 200 discussed in FIG. 2. The wafer-bonding chamber 400 can be a conventional wafer-bonding chamber (e.g., EVG 850 Series or the EVG 650 Series wafer bonders made by EV Group). More specifically, the wafer-bonding chamber 400 includes a chuck 402, a fixture 412, and pin handle 408, and a pin (Teflon pin) 410. A Si wafer 404 is placed on the chuck 402 for bonding. A Ge wafer 406 is placed on top the Si wafer 404 such that there is a slight tiny air gap between the Ge wafer 406 and the Si wafer 404 until the bonding is initiated. Alternatively, the Ge wafer 406 is first placed on the chuck 402. The Si wafer is then placed on top of the Ge wafer. The bonding is initiated by the pin 410, which is attached to the pin handle 408. The pin 410 applies a local force $F_1$ onto a region on the Ge wafer to initiate the bonding. Alternatively, the pin 410 applies the local force F, onto a region on the Si wafer in the example that the Ge wafer is on the bottom of the Si wafer to initiate the bonding. In one example, the region where the local force F, is applied to is located near the edge of the wafer as shown in FIGS. 4A and 4B. In a preferred embodiment, the pin 410 is able to apply a local force ranging from about 3 Newton to about 4000 Newton. The chamber 400 is able to maintain a bonding temperature ranging from about 22° C. to 500° C. The chamber 400 is also able to maintain a bonding pressure at below atmospheric pressure, and in some cases, as low as a pressure less than 1 Torr or as low as 1 mili Torr.

Figure 4C:
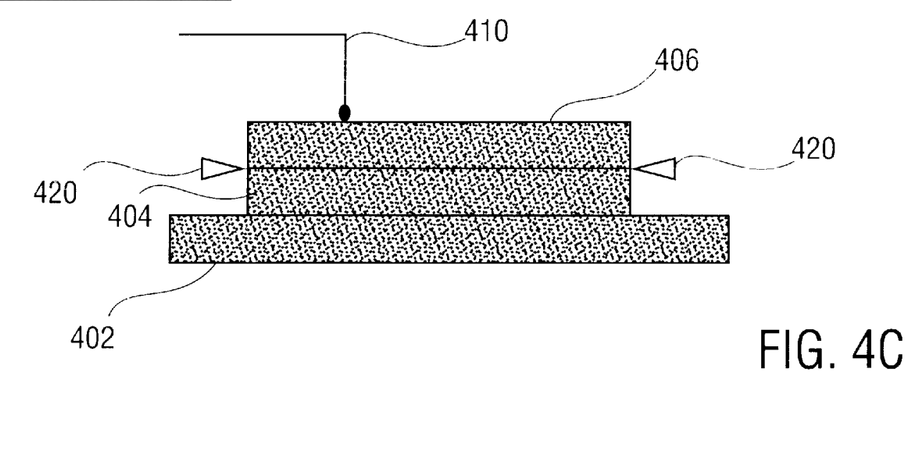

FIGS. 4B and 4C illustrate that in one example, the wafer-bonding chamber may include spaces 420 which can be inserted between the Ge wafer 406 and the Si wafer 404 until the bonding is initiated. When the Ge wafer 406 and the Si wafer 404 are ready for bonding, the spacers 420 are removed allowing the Ge wafer 406 and the Si wafer 404 to be in immediate contact as show in FIG. 4C.

In one example, the wafer pair (e.g., the Ge wafer bonded to the Si wafer) made in accordance with some of the embodiments discussed above is exposed to heat and cool down for stress hysteresis analysis. The stress hysteresis includes compressive stress and tensile stress analysis. The compressive stress measures the radius of the curvature of the Ge wafer as the wafer pair is being heated up. The tensile stress measures the radius of the curvature of the Ge wafer as the wafer pair is being cooled down. The wafer pair can be placed on a hot plate inside a conventional stress measurement tool. The conventional stress measure tool has a laser beam that can scan through the Ge wafer surface and reads the radius of the curvature of the Ge wafer as a function of the temperature.

In the example above, the hot plate temperature-is cycled up and down in a vacuum environment with increasing temperature end points in each temperature cycle. One exemplary cycle of heating the wafer pair includes (1) place the wafer pair on the hot plate; (2) ramp-the temperature up from room temperature to 200° C. at a rate of about 5° C. per minute; (3) hold the temperature at 200° C. for 10 minutes; (4) ramp the temperature down from 200° C. to room temperature at a rate of approximately 1° C. per minute or less; (5) ramp the temperature up from room temperature to 300° C. at a rate of about 5° C. per minute; (6) hold the temperature at 300° C. for 10 minutes; (7) ramp the temperature down from 300° C. to room temperature at a rate of approximately 3° C. per minute or less; (8) ramp the temperature up from room temperature to 400° C. at a rate of about 5° C. per minute; (9) hold the temperature at 400° C. for 10 minutes; (10) ramp the temperature down from 400° C. to room temperature at a rate of approximately 3° C. per minute or less; (11) ramp the temperature up from room temperature to 500° C. at a rate of about 5° C. per minute; (12) hold the temperature at 500° C. for 10 minutes; and (13) ramp the temperature down from 500° C. to room temperature at a rate of approximately 3° C. per minute or less.

Figure 5A:
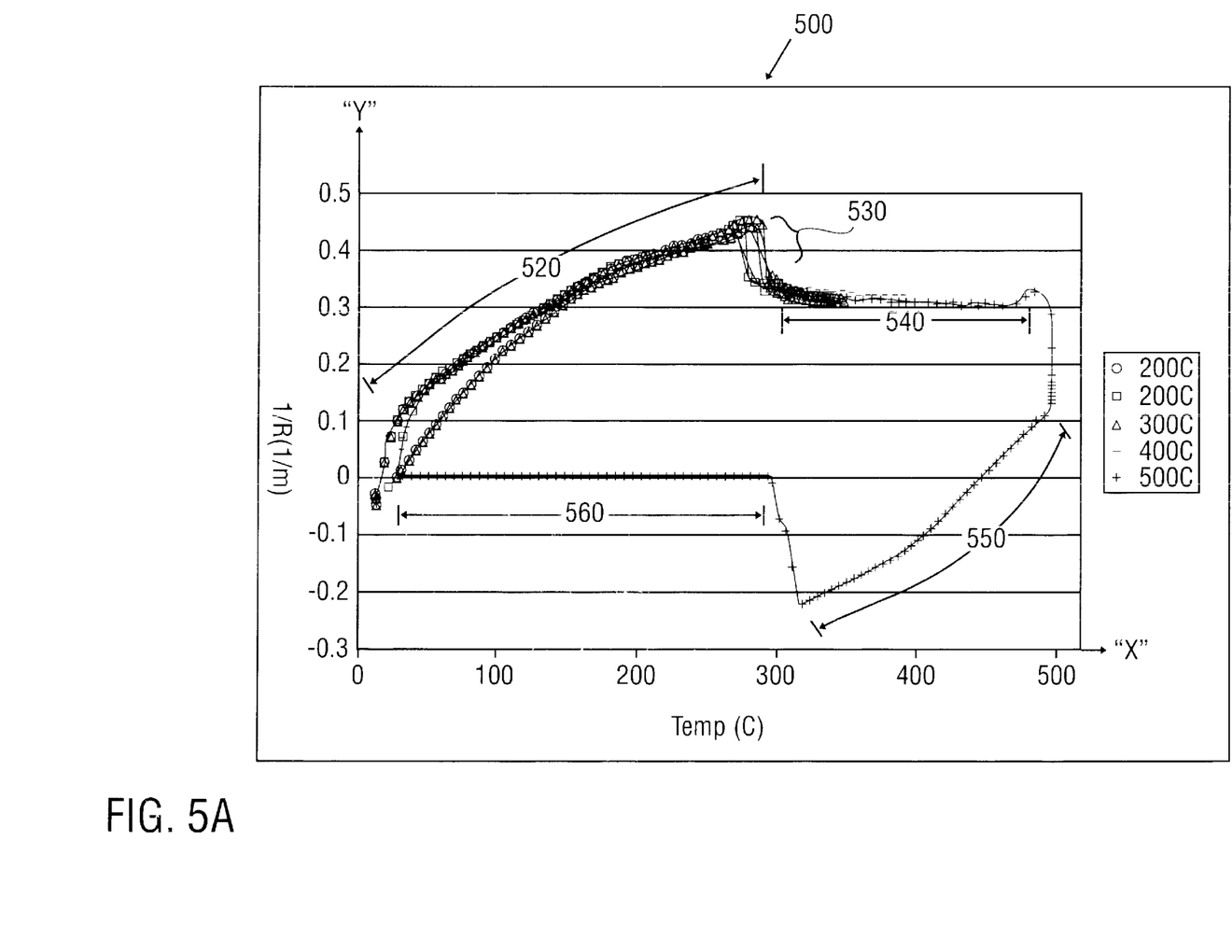
FIGS. 5A and 5B illustrate exemplary compressive stress point and fracture points for Ge wafer made in according to some of the embodiments.

FIG. 5A illustrates a stress hysteresis graph 500 of a 150 $\mu$m Ge wafer that is bonded to a 725 $\mu$m Si wafer using some of the embodiments described above. The Y-axis indicates the inverse radius (1/R (1/M)) of the curvature of the Ge wafer and the X-axis indicates the temperature (° C.) of the-heating and cooling cycles. As the wafer pair is being heated up, compressive stress increases and the radius of the curvature of the Ge wafer decreases indicated by the increase in the inverse radius. As the wafer pair is being cooled down, the tensile stress increases, the curvature returns, and the radius of the curvature increases. When the curvature decreases and increases following the same pattern, the Ge wafer experiences no hysteresis.

For example, in FIG. 5A, when the wafer pair is heated up to 200° C., the radius decreases, the inverse radius increases in the same direction as when the wafer pair is cooled down to room temperature from 200° C. (see section 520). At 200° C. the Ge wafer experiences no hysteresis. The same behavior is observed for when the wafer pair is heated up to 300° C. and cooled down to room temperature; no hysteresis is observed (see section 520).

When the wafer pair of FIG. 5A is heated above 300° C., e.g., 350° C. and 400° C., compressive stress is observed. (see section 530) The radius of the curvature of the Ge wafer experiences a shift in value. When the wafer pair is cooled down to room temperature from 350° C. or 400° C., little or no hysteresis is observed, although there is a shift in the value of the curvature. (see section 540). The shift in the curvature indicates some slipping, fracturing or threading of the wafer pair.

When the wafer pair of FIG. 5A is heated up to about 500° C. and cooled down to room temperature, the Ge wafer experiences hysteresis indicated by the different pattern of curvature change. And during cooling, at about 300° C., the curvature changes to almost 0. This behavior indicates fracture in the wafer. (see section 550 and 560).

Figure 5B:
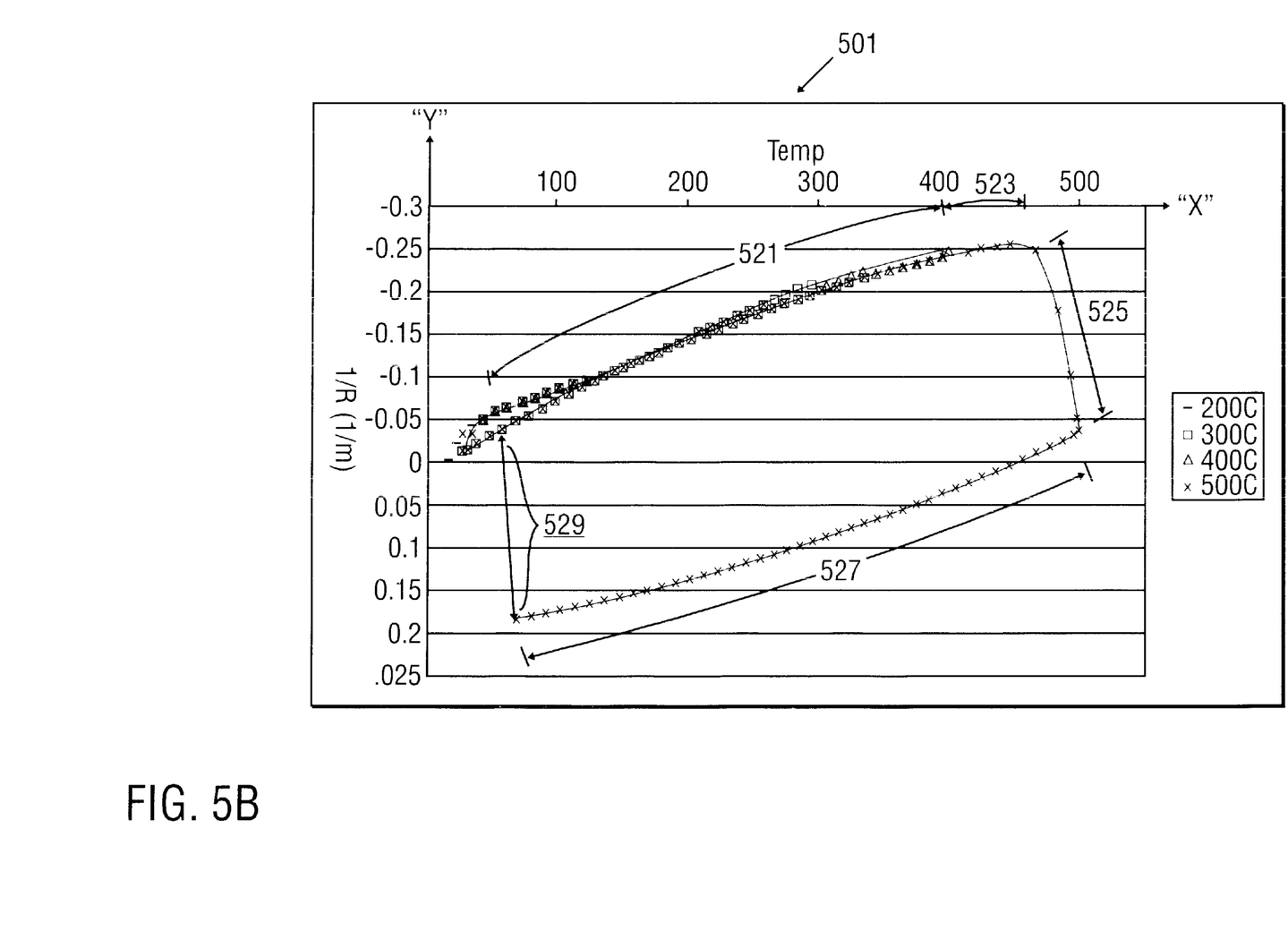

FIG. 5B illustrates a stress hysteresis graph 501 of a 20 $\mu$m Ge wafer bonded to a 600 $\mu$m Si wafer using some of the embodiments described above. Similar to FIG. 5A, the Y-axis indicates the inverse radius (1/R (1/M)) of the curvature of the Ge wafer and the X-axis indicates the temperature (° C.) of the heating and cooling cycles.

In FIG. 5B, when the wafer pair is heated up to 200° C., 300° C. and 400° C., and at each of those temperatures, cooled down to room temperature, the Ge wafer experiences no hysteresis. (see section 521) Furthermore, the Ge wafer experiences no shift in curvature radius and remains compressive up to about 450° C. (see section 523)

When the wafer pair is heated up to 500° C., the Ge wafer experiences a shift in radius. (see section 525) During cool down, the Ge wafer experiences little if any hysteresis. (see section 527) The Ge wafer experiences no fracture until cool down to a temperature near room temperature. (see section 529) In this example, when the wafer pair is heated up to 500° C., the Ge wafer only experiences tensile fold, meaning the curvature of the Ge wafer turns from being convex to concave. The wafer pair is still bonded and no slipping or fracture is seen until near room temperature.

Figure 6A:
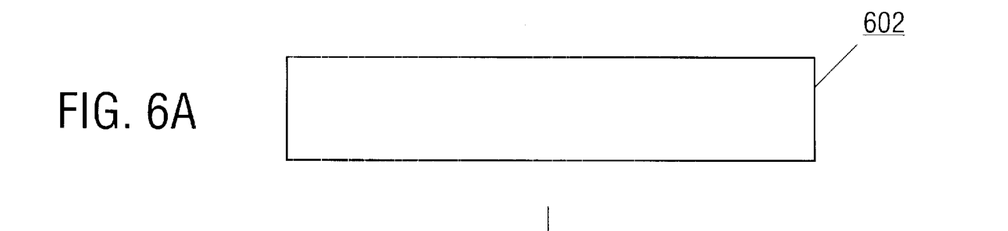
FIGS. 6A to 6G illustrate an exemplary semiconductor device (e.g., a transistor) that integrates a selectively deposited germanium film made in accordance to some of the embodiments.
Figure 6B:
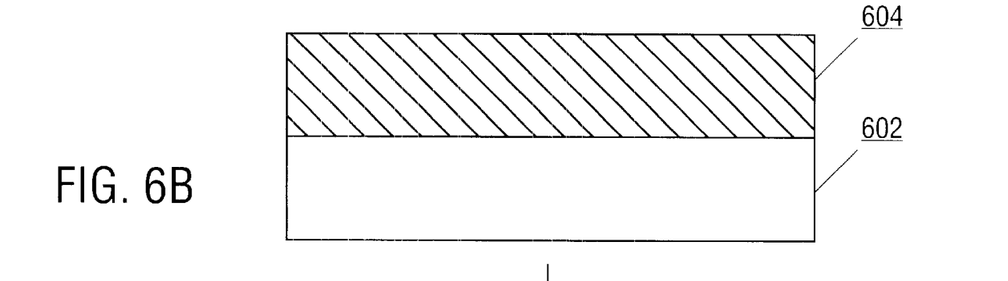
Figure 6C:
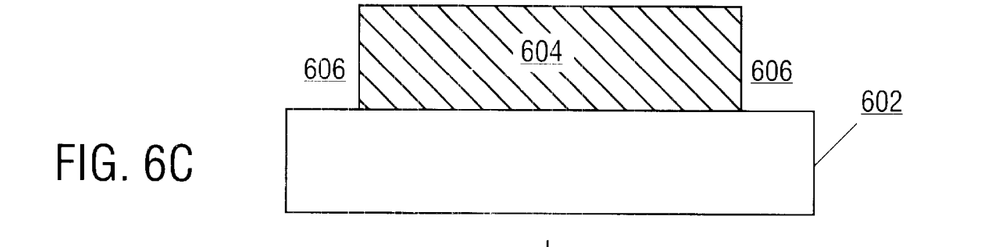
Figure 6D:
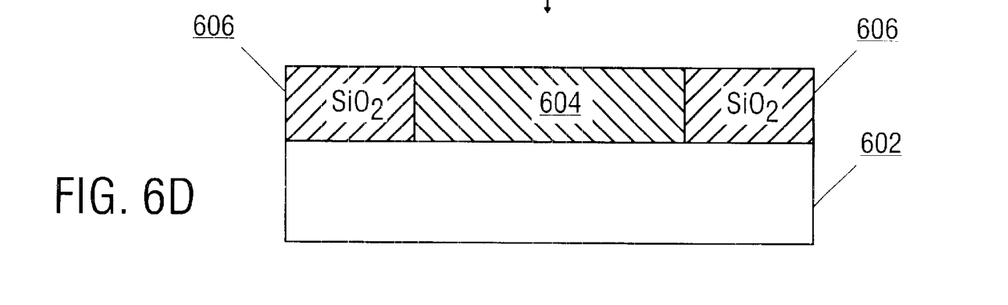

FIGS. 6A to 6G illustrate an exemplary process of making a Ge body transistor. The Ge wafer bonded to the Si wafer made according to the embodiments of the present invention can be used to integrate into making various electronic devices. FIGS. 6A to 6B illustrate that a silicon wafer 602 is bonded to a Ge wafer 604. In one example, the silicon wafer 602 is doped with suitable dopants for the transistor. In another example, the Si wafer 602 is a monocrystalline silicon. And, in yet another example, the Ge wafer 604 is a monocrystalline Ge. In one example, the Ge wafer may be moderately doped (e.g., $1 \times 10^{16}$ per cm$^3$ to $1 \times 10^{15}$ per cm$^3$). In one example, the doping concentration is chosen to properly target transistor threshold voltage. The Ge wafer 604 is bonded to the silicon wafer 602 according to the present invention. Shallow trench isolations 606 may be formed into the Ge wafer 604 using conventional methods (e.g., etching) to insulate one device from another, as shown in FIG. 5C. The shallow trench isolations 606 are first formed by convention etching method to first etch regions for the shallow trench isolation 606 and these regions are filled with an insulator, typically SiO$_2$ as shown in FIG. 6D. The etched region for the shallow trench isolation 606 can be of any suitable dept and as shown is FIG. 6C, sufficiently deep to remove most or all of the Ge from the shallow trench isolator 606. In one example, a conventional chemical mechanical polishing method may be used to polish the SiO$_2$ to ensure sufficient planarity.

Figure 6E:
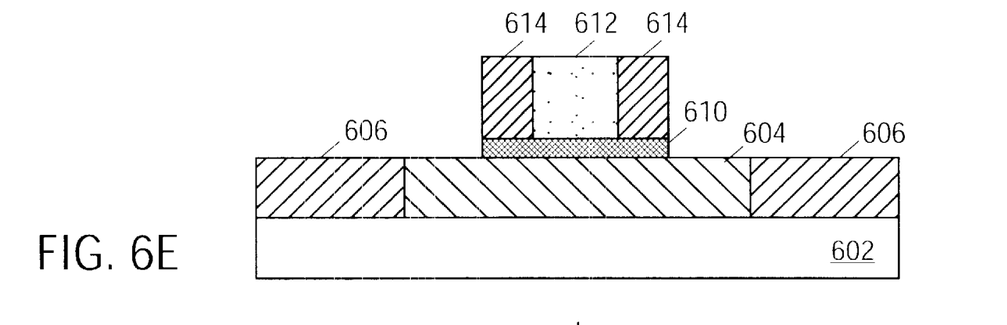

FIG. 6E illustrates that a gate dielectric 610, a gate electrode 612, and spacers 614 can be formed on the top surface of the Ge wafer 604 using conventional methods (e.g., conventional film deposition and patterning). In one example, the gate dielectric 610 can be deposited by a blanket deposition of a high-k oxide film. The deposition of the gate dielectric 610 is necessary since germanium does not form a stable oxide. In one example, the gate dielectric 610 is made out of a high-k dielectric material such as zirconium oxide (ZrO$_2$). The gate electrode 612 can also be formed by a blanket deposition. The gate electrode 612 can be made out of a metal containing material, such as titanium nitride or tungsten, for a metal gate. The gate electrode 612 can be appropriately doped poly-Silicon such as for a conventional gate. In one example, after the gate dielectric 610 and the gate electrode 612 are blanket deposited over the Ge wafer 604, they are patterned to define the dimension of the gate dielectric 610 and the gate electrode 612. The gate dielectric 610 and the gate electrode 612 are patterned in a single process. The spacers 614, typically comprise of a combination of SiO$_2$ and Si$_3$N$_4$, are also formed, first, by blanket deposition. And then, the spacers 614 are defined using conventional spacer etching method.

Figure 6F:
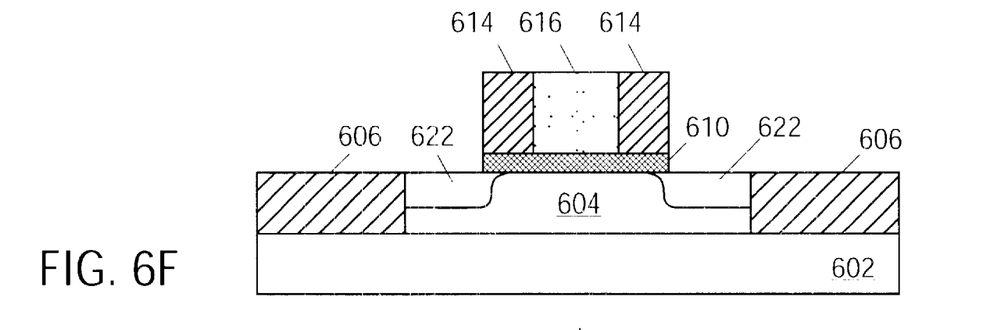

FIG. 6F illustrates that source and drain regions 622 may be formed in the Ge wafer 604 using conventional methods. The source and drain regions 622 may be heavily doped with a dopant concentration of $1 \times 10^{20}$ per cm$^3$.

Figure 6G:
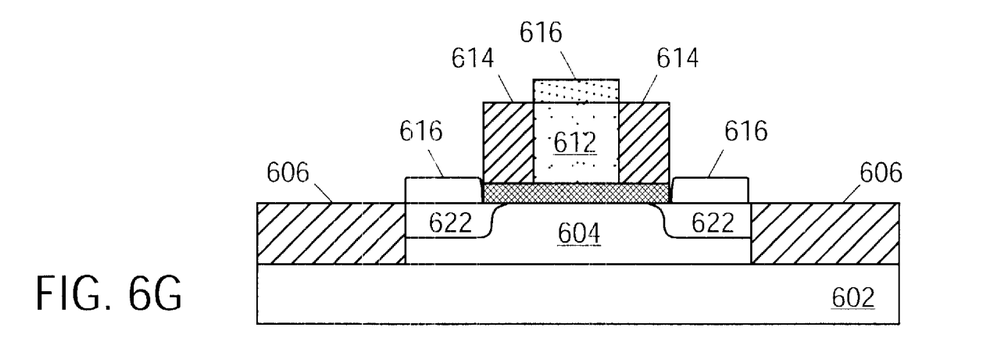

FIG. 6G illustrates that a nickel-germanium (NiGe) layer 616 may be formed on the Ge wafer 604 over the regions that are not covered with the gate dielectric 610 and the spacers 614. In one example, the NiGe is formed by a low-temperature annealing method using an annealing temperature of about 400° C. to 600° C. Depositing a metal (e.g., nickel) that reacts with the material in the transistor body can substantially lower the resistivity of the source and drain contacts. Conventional methods are used to anneal the substrate 602. The annealing temperature for the transistor 600 comprising the Ge wafer 604 is kept low, 400° C. to 600° C., to prevent the refractory metal from agglomerating, which tends to increase the resistivity of the source and drains 605 and degrade the performance of the transistor 600. The refractory metal used to anneal the transistor 600 comprising the Ge wafer 604 is preferably nickel (Ni). Alternatively, another metal with low resistivity can be used.

Those skilled in the art will recognize that the features mentioned in FIGS. 6A to 6G and other features may be used or may be left out, depending upon the particular function of the device. For example, after the formation of the NiGe, the transistor 600 is subjected to convention process of forming interlayer dielectric deposition, contact patterning, metalization, etc.

Figure 7A:
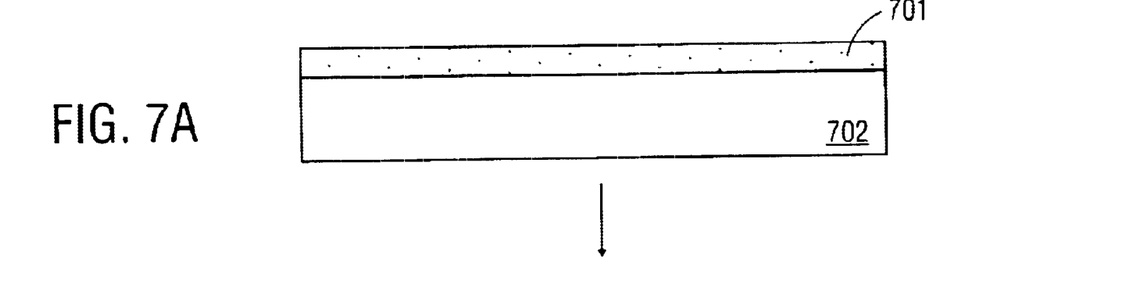
FIGS. 7A–7D and 7F–7G illustrate another exemplary semiconductor device (e.g., a transistor) that integrates a bonded germanium film made in accordance to some of the embodiments.
Figure 7B:
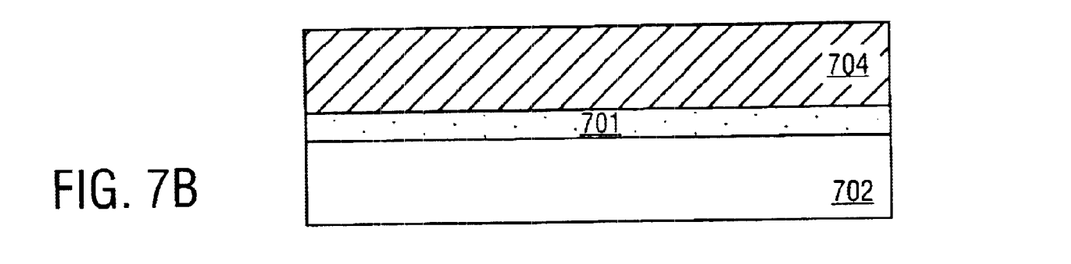
Figure 7C:
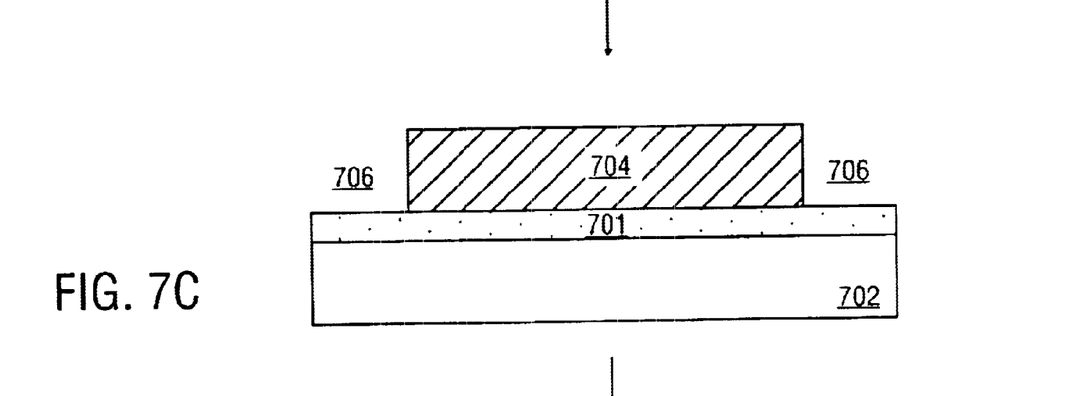
Figure 7D:
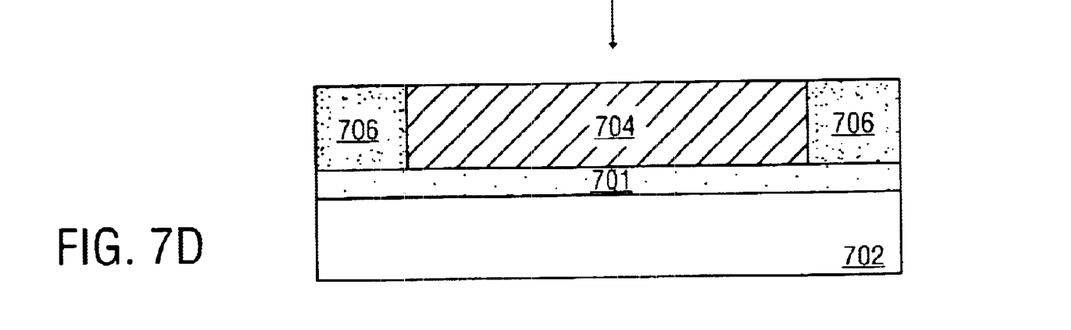

FIGS. 7A to 7D illustrate another electronic device that can use the wafer pair made according to the embodiments discussed. The electronic device is an integrated detector comprising germanium that may provide electrical output driven by an optical input to integrated circuits in a substrate. FIG. 7A illustrates that a Si wafer 702 of the present electronic device includes an oxide layer, silicon dioxide layer 701. Furthermore, the Si wafer 707 may be a monocrystalline silicon having a $SiO_2$ layer 701. At FIG. 7B, a Ge wafer 704 is bonded to the silicon dioxide layer 701 according to the present invention. The Ge wafer 704 may be a monocrystalline Ge. In one example, Ge wafer 74 is not doped to ensure maximum performance for the detector. The Ge wafer 704 may also include shallow trench isolations 707 formed using conventional methods (e.g., etching) to insulate one device from another as shown in FIG. 7C. The shallow trench isolations 706 are formed by conventional etching method to first etch regions for the shallow trench isolation 706 and these regions are filled with an insulator, typically $SiO_2$. The etched region for the shallow trench isolation 706 can be of any suitable dept and as shown in FIG. 7C, sufficiently deep to remove most or all of the Ge from the shallow trench isolation 706. In one example, a conventional chemical mechanical polishing method may be used to polish the $SiO_2$ to ensure sufficient planarity as shown in FIG. 7D.

Figure 7F:
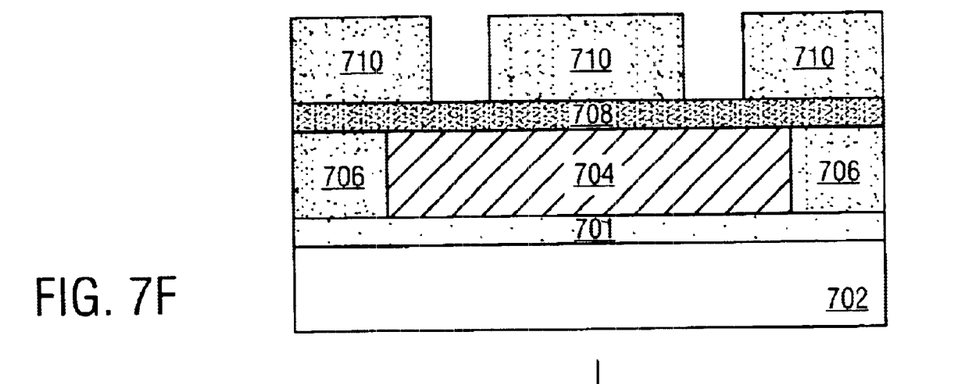

FIG. 7F illustrates that a waveguide 708 is formed on the Ge wafer 704 using conventional methods. The waveguide 708 is further encapsulated by an oxide layer 710 which are dielectric layers. It is common for the integrated structure to have the waveguide 708 be made out of a relatively high-refractive index material (e.g., $Si_3N_4$ which has a refractive index n=2.05). The waveguide 708 is typically encapsulated in a material with lower refractive index (e.g., $SiO_2$ which has a refractive index n=1.46). When light is introduced in the waveguide 708 having the high refractive index material, the light will be confined there. The waveguide 708 then "guides" the light from the source (typically an external laser) to the detector (in this case the Ge wafer 704).

Figure 7G:
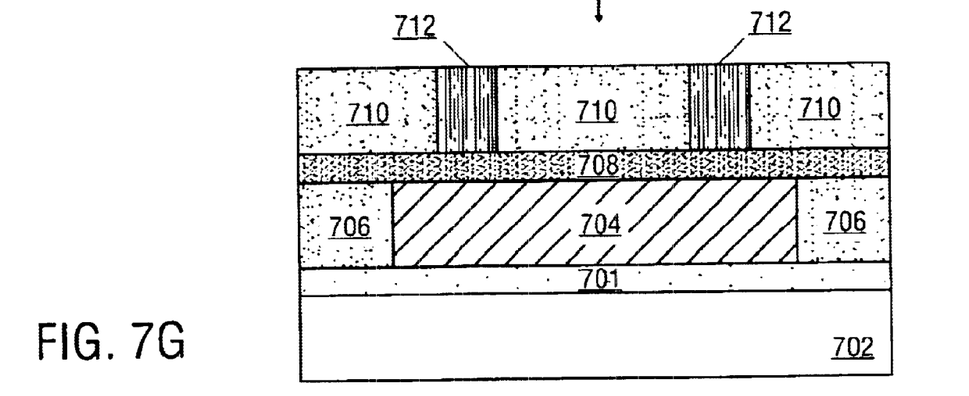

FIG. 7G illustrates that detector electrodes 712 are formed in the top oxide layer 710. In order for the Ge wafer 704 to function as a detector, a bias must be applied across it. Any light shining on the detector then generates electron-hole pairs. These pairs are swept by the bias field, causing current to flow through the Ge wafer 704. There is an electrical response to a light impulse. The detector electrodes 712 are needed to provide the required bias. In one example, a conductive material, such as metal, is deposited and then patterned using conventional methods. In this example, the detector electrodes 712 are deposited by a damascene process, well practiced in the field. More specifically, a trench is defined with standard litho techniques in the top oxide layer 710 as shown in FIG. 7F; then, a metal is deposited everywhere (so that the trench is completely filled); then, the excess metal on the top surface of the top oxide layer 710 is polished off to give the detector shown in FIG. 7G.

The methods made in accordance with the present invention, such as those exemplary embodiments discussed above, enable the making of electronic devices having Ge film that is substantially defect-free. The germanium film made according to the present invention can be easily integrated into semiconductor devices. The methods enable the making of semiconductor devices that take advantage of the desirable material properties of Ge and at the same time integrate with Si modern manufacturing techniques.

We claim:

1. A method of forming a substantially defect-free germanium film on a semiconductor wafer comprising:

treating a semiconductor wafer to provide said semiconductor wafer with a first hydrophilic surface;

placing said semiconductor wafer in a wafer-bonding chamber;

treating a germanium wafer to provide said germanium wafer with a second hydrophilic surface;

placing said germanium wafer on top of or on bottom of said semiconductor wafer, said first hydrophilic surface facing said second hydrophilic surface; and applying a local force to one of said germanium wafer and said semiconductor wafer to initiate bonding of said germanium wafer to said semiconductor wafer, said bonding forms a wafer pair.

2. A method as in claim 1 further comprising:

annealing said wafer pair after said germanium wafer is bonded to said semiconductor wafer.

3. A method as in claim 2 wherein an annealing temperature for said annealing ranges from 100° C. to 600° C.

4. A method as in claim 1 further comprising:

thinning said germanium wafer bonded to said semiconductor wafer to a desired thickness.

5. A method as in claim 1 wherein said semiconductor wafer is selected from a group consisting of a silicon wafer and a silicon wafer having a silicon oxide layer formed thereon.

6. A method as in claim 1 wherein said applying a local force to one of said germanium wafer and said semiconductor wafer comprises:

applying a force ranging from 3 Newton to 4000 Newton to a region near an edge of said one of said germanium wafer and said semiconductor wafer.

7. A method as in claim 1 further comprising:

obtaining a bonding condition for said wafer-bonding chamber.

8. A method as in claim 7 wherein said obtaining said bonding condition includes obtaining a bonding temperature and a bonding pressure.

9. A method as in claim 8 wherein said bonding temperature ranges from 22° C. to 600° C.

10. A method as in claim 8 wherein said bonding pressure is a sub-atmospheric pressure to place said wafer-bonding chamber under a vacuum condition.

11. A method of forming a substantially defect-free germanium film on a semiconductor wafer comprising:

cleaning a silicon wafer to provide said silicon wafer with a first hydrophilic surface;

cleaning a germanium wafer to provide said germanium wafer with a second hydrophilic surface;

placing said silicon wafer in a wafer-bonding chamber;

placing said germanium wafer on top or on bottom of said silicon wafer, said first hydrophilic surface facing said second hydrophilic surface;

applying a local force to a region near an edge of one of said germanium wafer and said silicon wafer to initiate bonding of said germanium wafer to said silicon wafer, said bonding forming a wafer pair; and annealing said wafer pair after said germanium wafer is bonded to said silicon wafer.

12. A method as in claim 11 further comprising:

thinning said germanium wafer bonded to said silicon wafer to a desired thickness.

13. A method as in claim 11 wherein an annealing temperature for said annealing ranges from 100° C. to 600° C., wherein a bonding temperature for said wafer-bonding chamber ranges from 22° C. to 600° C., and wherein a bonding pressure for said wafer-bonding chamber is less than 1 Torr.

14. A method as in claim 11 wherein said applying a local force to one of said germanium wafer and said silicon wafer comprises applying a force ranging from 3 Newton to 4000 Newton.

15. A method as in claim 11 wherein said silicon wafer having a silicon oxide layer formed thereon.

16. A method as in claim 1 wherein said treating said germanium wafer to provide said germanium wafer with said second hydrophilic surface comprises treating said germanium wafer with a hydrofluoric solution.

17. A method as in claim 16 wherein said hydrofluoric solution is about less than 0.05% (v/v).

18. A method as in claim 1 further comprising:

annealing said wafer pair after said germanium wafer is bonded to said semiconductor wafer, said annealing includes ramping up temperature at a rate of about or less than 1° C./min and ramping down temperature at a rate of about or less than 2° C./min.

19. A method as in claim 18 wherein an annealing temperature for said annealing ranges from 100° C. to 600° C.

20. A method as in claim 11 further comprising:

annealing said wafer pair after said germanium wafer is bonded to said semiconductor wafer, said annealing includes ramping up temperature at a rate of about or less than 1° C./min and ramping down temperature at a rate of about or less than 2° C./min.

21. A method as in claim 20 wherein an annealing temperature for said annealing ranges from 100° C. to 600° C.

22. A method of forming a substantially defect-free germanium film on a semiconductor wafer comprising:

treating a semiconductor wafer to provide said semiconductor wafer with a first hydrophilic surface;

placing said semiconductor wafer in a wafer-bonding chamber;

treating a germanium wafer to provide said germanium wafer with a second hydrophilic surface;

placing said germanium wafer on top of or on bottom of said semiconductor wafer, said first hydrophilic surface facing said second hydrophilic surface;

introducing a moisture containing carrier gas into said wafer-bonding chamber; and applying a local force to one of said germanium wafer and said semiconductor wafer to initiate bonding of said germanium wafer to said semiconductor wafer, said bonding forms a wafer pair.

23. A method as in claim 22 further comprising:

annealing said wafer pair after said germanium wafer is bonded to said semiconductor wafer, said annealing includes ramping up temperature at a rate of about or less than 1° C./min and ramping down temperature at a rate of about or less than 2° C./min.

24. A method as in claim 23 wherein said annealing further comprising:

ramping up temperature for said annealing at a rate of about 1° C./min and maintaining said temperature at about 100° C. for about 2 hours; and ramping up said temperature from about 100° C. to about 150° C. at a rate of about 1° C./min maintaining said temperature at about 150° C. for about 6 hours.

25. A method as in claim 22 wherein an annealing temperature for said annealing ranges from 100° C. to 600° C.

* * * * *

UNITED STATES PATENT AND TRADEMARK OFFICE
CERTIFICATE OF CORRECTION

PATENT NO. : 6,645,831 B1
DATED : November 11, 2003
INVENTOR(S) : Shaheen et al.

It is certified that error appears in the above-identified patent and that said Letters Patent is hereby corrected as shown below:

Column 1,
Line 57, before "Ge's", insert -- the --.
Line 60, after "directly", insert -- to --.

Signed and Sealed this

Sixth Day of April, 2004

JON W. DUDAS
*Acting Director of the United States Patent and Trademark Office*